United States Patent
Kuraoka et al.

(10) Patent No.: US 9,660,138 B2
(45) Date of Patent: May 23, 2017

(54) LIGHT EMITTING DEVICE AND METHOD FOR MANUFACTURING LIGHT EMITTING DEVICE

(71) Applicant: NGK INSULATORS, LTD., Aichi (JP)

(72) Inventors: Yoshitaka Kuraoka, Okazaki (JP); Shohei Oue, Nagoya (JP); Masahiko Namerikawa, Seto (JP); Morimichi Watanabe, Nagoya (JP)

(73) Assignee: NGK INSULATORS, LTD., Aichi (JP)

( * ) Notice: Subject to any disclaimer, the term of this patent is extended or adjusted under 35 U.S.C. 154(b) by 0 days.

(21) Appl. No.: 15/391,160

(22) Filed: Dec. 27, 2016

(65) Prior Publication Data

US 2017/0110624 A1 Apr. 20, 2017

Related U.S. Application Data

(60) Division of application No. 15/065,994, filed on Mar. 10, 2016, which is a continuation of application No. PCT/JP2015/069722, filed on Jul. 9, 2015.

(30) Foreign Application Priority Data

Oct. 1, 2014 (JP) .................. 2014-202818

(51) Int. Cl.
- *H01L 21/00* (2006.01)
- *H01L 33/00* (2010.01)
- *H01L 27/15* (2006.01)

(Continued)

(52) U.S. Cl.
CPC ........ *H01L 33/0075* (2013.01); *H01L 33/025* (2013.01); *H01L 33/06* (2013.01);

(Continued)

(58) Field of Classification Search
CPC ....... H01L 33/025; H01L 33/06; H01L 33/08; H01L 33/18; H01L 33/20; H01L 29/045;

(Continued)

(56) References Cited

U.S. PATENT DOCUMENTS

| 8,895,337 B1 | 11/2014 | Wang et al. |
| 9,090,988 B2 | 7/2015 | Sakai et al. |

(Continued)

FOREIGN PATENT DOCUMENTS

| JP | 09-027636 A | 1/1997 |
| JP | 3410863 B2 | 3/2003 |

(Continued)

OTHER PUBLICATIONS

Kikuchi, A., et al., "InGaN/GaN Multiple Quantum Disk Nanocloumn Light-Emitting Diodes," Japanese Journal of Applied Physics 2004;43(12A):L1524-L1526.

(Continued)

*Primary Examiner* — Hsien Ming Lee
(74) *Attorney, Agent, or Firm* — Cermak Nakajima & McGowan LLP; Tomoko Nakajima

(57) ABSTRACT

A method for manufacturing a light emitting device includes a) forming a first light confinement layer having a plurality of openings on or above one main surface of an oriented polycrystalline substrate, said oriented polycrystalline substrate including a plurality of oriented crystal grains; b) stacking an n-type layer, an active layer, and a p-type layer; c) forming a second light confinement layer on said first light confinement layer so that said second light confinement layer covers said plurality of first columnar structures and said second columnar structure; d) forming a transparent conductive film on said second light confinement layer; e) forming a pad electrode on said transparent conductive film; and f) forming a cathode electrode electrically connected to ends of said plurality of first columnar structures closer to said oriented polycrystalline substrate.

10 Claims, 6 Drawing Sheets

(51) Int. Cl.
   *H01L 33/32*   (2010.01)
   *H01L 33/06*   (2010.01)
   *H01L 33/58*   (2010.01)
   *H01L 33/02*   (2010.01)
   *H01L 33/42*   (2010.01)
   *H01L 33/62*   (2010.01)

(52) U.S. Cl.
   CPC .............. *H01L 33/32* (2013.01); *H01L 33/42* (2013.01); *H01L 33/58* (2013.01); *H01L 33/62* (2013.01); *H01L 2933/0016* (2013.01); *H01L 2933/0033* (2013.01); *H01L 2933/0058* (2013.01); *H01L 2933/0066* (2013.01)

(58) Field of Classification Search
   CPC . H01L 29/06; H01L 29/0603; H01L 29/0684; H01L 29/30; H01L 29/41
   See application file for complete search history.

(56) References Cited

U.S. PATENT DOCUMENTS

| | | |
|---|---|---|
| 9,184,235 B2 | 11/2015 | Brandt et al. |
| 2016/0190392 A1 | 6/2016 | Kuraoka et al. |

FOREIGN PATENT DOCUMENTS

| | | |
|---|---|---|
| JP | 2009-076896 A | 4/2009 |
| JP | 2013-055170 A | 3/2013 |
| WO | WO2013/147326 A1 | 10/2013 |

OTHER PUBLICATIONS

International Search Report for PCT Patent App. No. PCT/JP2015/069722 (Oct. 6, 2015).

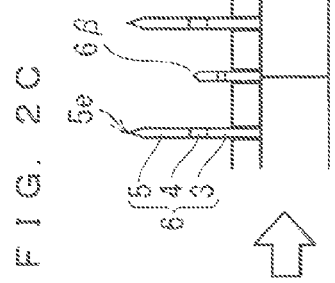
FIG. 2A
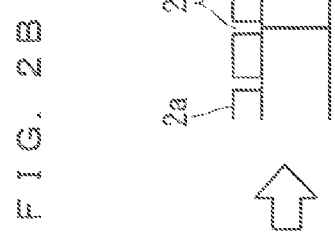
FIG. 2B
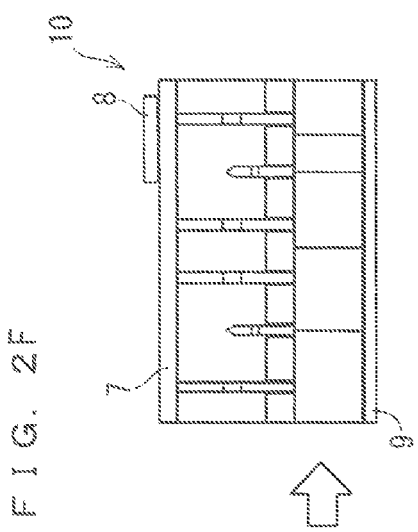
FIG. 2C
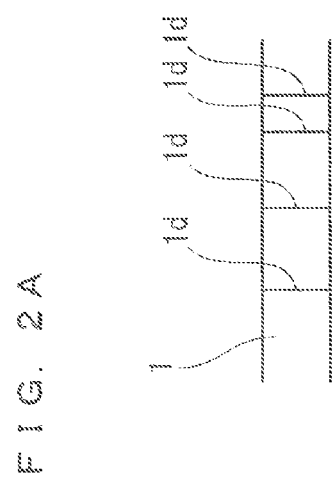
FIG. 2D
FIG. 2E
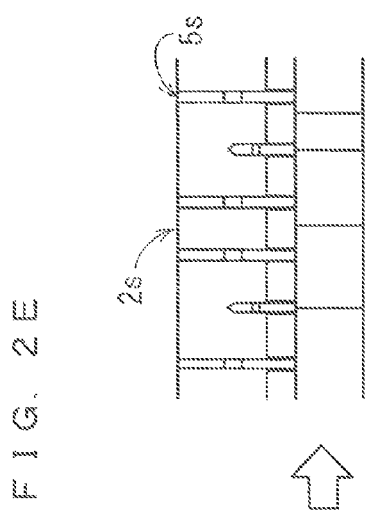
FIG. 2F
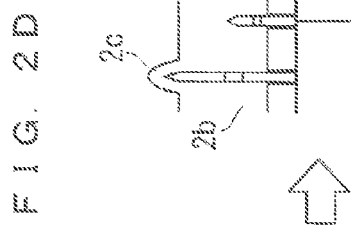

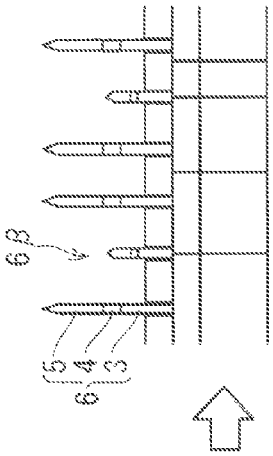
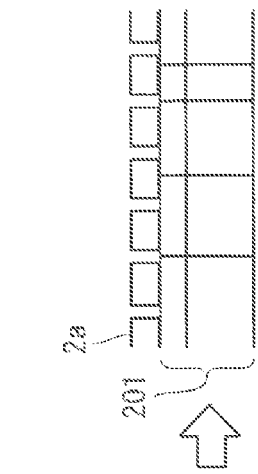
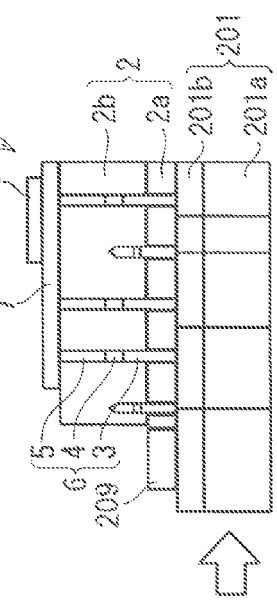
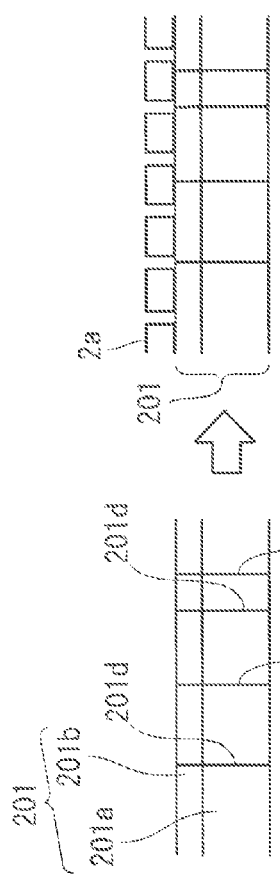
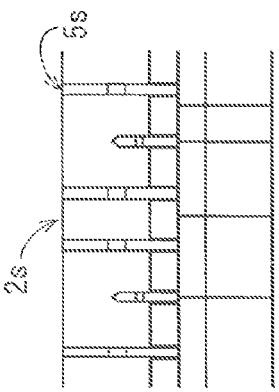
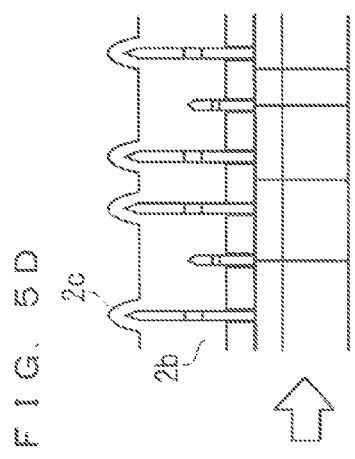

LIGHT EMITTING DEVICE AND METHOD FOR MANUFACTURING LIGHT EMITTING DEVICE

This application is a Divisional of, and claims priority under 35 U.S.C. §120 to, U.S. patent application Ser. No. 15/065,994, filed on Mar. 10, 2016, which was a Continuation of, and claimed priority under 35 U.S.C. §120 to, International Application No. PCT/JP2015/069722, filed on Jul. 9, 2015, which claimed priority therethrough under 35 U.S.C. §119 to Japanese Patent Application No. 2014-202818, filed on Oct. 1, 2014, the entireties of which are incorporated by reference.

BACKGROUND OF THE INVENTION

Field of the Invention

The present invention relates to light emitting devices and, in particular, to the structure thereof.

Description of the Background Art

A light emitting device (LED) including a light emitting part made of a Group 13 nitride (Group III nitride) is already widely known. The previously known light emitting device usually includes a substrate (different-material substrate) made of a material, such as sapphire, different from the Group 13 nitride as an underlying substrate, and a plurality of crystalline layers made of the Group 13 nitride are stacked on the underlying substrate.

For example, a self-emitting display that includes a substrate at least having an insulating surface, lower wiring formed on the substrate, a silicon nitride film serving as a mask, and a plurality of columnar light emitting parts formed at positions of a plurality of openings of the mask, is already well known (see, for example, Japanese Patent Application Laid-open Publication No. 2013-55170). The substrate is, for example, a sapphire substrate, a ceramic substrate, and a silicon substrate on which a silicon oxide film has been formed. The lower wiring includes a silicon thin film and an n-type GaN layer. The plurality of columnar light emitting parts are formed by stacking a semiconductor layer of a first conductivity type, an active layer, and a semiconductor layer of a second conductivity type each made of the Group 13 nitride at positions of the plurality of openings. In the self-emitting display, a lower refractive index material having a lower refractive index than a semiconductor, which is a material for the light emitting parts, is located around the light emitting parts.

Technology for densely forming columnar LED structures made of the Group 13 nitride and referred to as nanocolumns as they each have a diameter of 1 μm or less on an n-type silicon monocrystalline substrate by RF-MBE is also already well known (see, for example, Akihiko Kikuchi, Mizue Kawai, Makoto Tada, and Katsumi Kishino, "InGaN/GaN Multiple Quantum Disk Nanocolumn Light-Emitting Diodes Grown on (111) Si Substrate", Japanese Journal of Applied Physics, Vol. 43, No. 12A, 2004, pp. L1524-L1526).

Furthermore, technology for manufacturing an oriented polycrystalline substrate made of a compound semiconductor having an orientation in a c-axis direction and technology for forming a nitride compound semiconductor film on the substrate to stack a semiconductor layer including a light emitting layer are well known (see, for example, Japanese Patent No. 3410863).

On the other hand, a method for manufacturing a gallium nitride monocrystalline free-standing substrate by a flux method is also already well known (see, for example, WO2013/147326).

One factor that prevents the previously known light emitting device including the different-material substrate as the underlying substrate from having improved emission intensity is the difference in lattice constant and coefficient of thermal expansion between the underlying substrate and the Group 13 nitride layers. The difference causes propagation of dislocations in the Group 13 nitride layers constituting the light emitting parts, and current leakages occur at positions of the dislocations.

Use of the gallium nitride monocrystalline free-standing substrate as the underlying substrate solves the problem of the difference in lattice constant and coefficient of thermal expansion from the Group 13 nitride layers, but causes another problem of a rising device manufacturing cost as it is not easy to increase the area of the gallium nitride monocrystalline free-standing substrate.

The light emitting devices disclosed in Japanese Patent Application Laid-open Publication No. 2013-55170 and Kikuchi et al. include the different-material substrates, but have improved luminous efficiency by devising the structure thereof. Technology disclosed in Japanese Patent Application Laid-open Publication No. 2013-55170, however, has a problem in that a light emitting device having a vertical structure cannot be configured due to the use of an insulating substrate. Technology disclosed in Kikuchi et al. can be used to form light emitting parts with reduced dislocations and strain, but has cost restraints due to the use of the silicon monocrystalline substrate.

SUMMARY OF THE INVENTION

The present invention relates to light emitting devices and, in particular, to the structure thereof.

According to an aspect of the present invention, a light emitting device includes an oriented polycrystalline substrate, a plurality of columnar light emitting parts, a light confinement layer, and an imperfect columnar part. The oriented polycrystalline substrate includes a plurality of oriented crystal grains. The plurality of columnar light emitting parts are each a columnar part having a longitudinal direction matching a normal direction of the oriented polycrystalline substrate, and are discretely located on or above one main surface of the oriented polycrystalline substrate at positions which are included in positions of lattice points of a planar lattice and under which there are no crystal defects. The lattice points are imaginarily determined on the one main surface of the oriented polycrystalline substrate and have a predetermined period. The light confinement layer is made of a material having a lower refractive index than a material for the plurality of columnar light emitting parts, and is located on or above the oriented polycrystalline substrate so as to surround the plurality of columnar light emitting parts. The imperfect columnar part is a columnar part having a shorter longitudinal size than the plurality of columnar light emitting parts, and is located on or above the one main surface of the oriented polycrystalline substrate at a position which is included in the positions of the lattice points of the planar lattice and under which there is a crystal defect.

According to the aspect of the present invention, a light emitting device having high light extraction efficiency and suppressed current leakages while including the oriented polycrystalline substrate, which is less expensive and easier to manufacture than a monocrystalline substrate, as an underlying substrate can be achieved.

According to another aspect of the present invention, a method for manufacturing a light emitting device includes the steps a), b), c), d), e), and f). The step a) is a step of forming a first light confinement layer having a plurality of openings on or above one main surface of an oriented polycrystalline substrate. The oriented polycrystalline substrate includes a plurality of oriented crystal grains so that the one main surface has a first area in which there are no crystal defects and a second area in which there is a crystal defect. The step b) is a step of stacking an n-type layer, an active layer, and a p-type layer in the stated order in each of the plurality of openings on or above the one main surface of the oriented polycrystalline substrate using the first light confinement layer as a mask to thereby form a plurality of columnar structures. The plurality of columnar structures include a plurality of first columnar structures formed in openings on or above the first area and a second columnar structure formed in an opening on or above the second area and having a shorter longitudinal size than the plurality of first columnar structures. The step c) is a step of forming a second light confinement layer on the first light confinement layer so that the second light confinement layer covers the plurality of first columnar structures and the second columnar structure. The second light confinement layer is formed of the same material as the first light confinement layer. The step d) is a step of forming a transparent conductive film on the second light confinement layer so that the transparent conductive film is electrically connected only to the plurality of first columnar structures and is not electrically connected to the second columnar structure. The step e) is a step of forming a pad electrode on the transparent conductive film. The pad electrode serves as an anode electrode. The step f) is a step of forming a cathode electrode electrically connected to ends of the plurality of first columnar structures closer to the oriented polycrystalline substrate. In the step a), the plurality of openings are determined as positions of lattice points of a planar lattice having a predetermined period regardless of whether there is the first area or the second area under each of the plurality of openings. In the steps a) and c), the first light confinement layer and the second light confinement layer are formed of a material having a lower refractive index than a material for the plurality of first columnar structures.

According to the other aspect of the present invention, the light emitting device having high light extraction efficiency and suppressed current leakages while including the oriented polycrystalline substrate, which is less expensive and easier to manufacture than the monocrystalline substrate, as the underlying substrate can be achieved.

In addition, although the positions of the openings are determined in a mechanical manner as the positions of the lattice points of the planar lattice regardless of whether there is a crystal defect immediately under each of the plurality of openings, only the first columnar structures formed on or above the first area of the underlying substrate in which there are no crystal defects can properly be used as the columnar light emitting parts.

The present invention thus aims to provide a light emitting device that is inexpensive, is easy to manufacture, and has high light extraction efficiency. These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A to 2F schematically show the light emitting device 10 during manufacture.

FIGS. 5A to 5F schematically show a light emitting device 210 according to a second embodiment during manufacture.

DESCRIPTION OF THE PREFERRED EMBODIMENTS

Group numbers of the periodic table appearing in the present specification are based on the group numbers 1 to 18 shown in the revised version of Nomenclature of Inorganic Chemistry published in 1989 by the International Union of Pure Applied Chemistry (IUPAC). Group 13 elements refer to aluminum (Al), gallium (Ga), indium (In), and the like, Group 14 elements refer to silicon (Si), germanium (Ge), tin (Sn), lead (Pb), and the like, and Group 15 elements refer to nitrogen (N), phosphorus (P), arsenic (As), antimony (Sb), and the like.

First Embodiment

<Structure of Light Emitting Device>

Figure 1A:
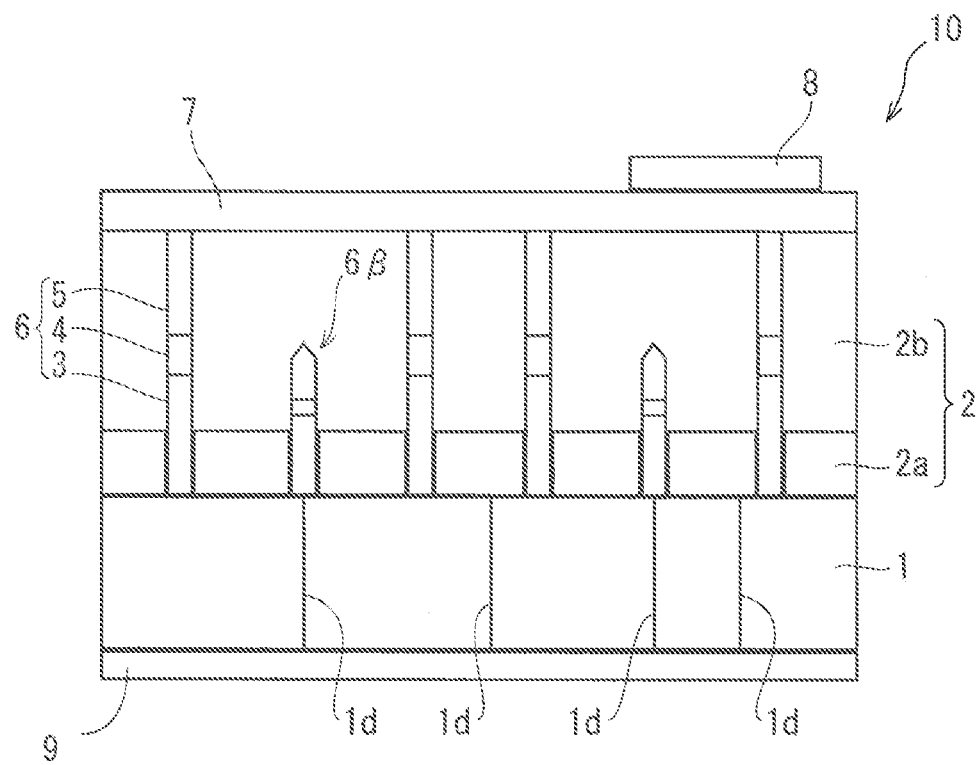
FIGS. 1A and 1B schematically show the structure of a light emitting device 10 according to a first embodiment.
Figure 1B:
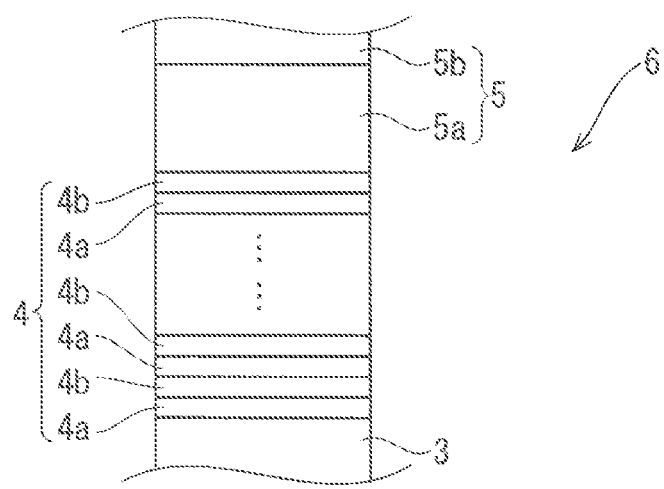

FIGS. 1A and 1B schematically show the structure of a light emitting device 10 according to the present embodiment. FIG. 1A is a schematic sectional view of the light emitting device 10 as a whole. As shown in FIG. 1A, the light emitting device 10 mainly includes an underlying substrate 1, a light confinement layer 2 formed of a first light confinement layer 2a and a second light confinement layer 2b stacked in the stated order from an underlying substrate side, a plurality of columnar light emitting parts (first columnar structures) 6 each formed of an n-type layer 3, an active layer 4, and a p-type layer 5 that are each made of a Group 13 nitride (Group III nitride) and are stacked in the stated order from the underlying substrate side, a transparent conductive film 7, a pad electrode 8, and a cathode electrode 9. The light emitting device 10 has an approximately vertical light emitting device structure, and emits light from the plurality of columnar light emitting parts 6 located between the pad electrode 8 and the cathode electrode 9 when current flows between the pad electrode 8 and the cathode electrode 9.

FIG. 1B is a sectional view showing the detailed structure of each of the columnar light emitting parts 6. As shown in FIG. 1B, the active layer 4 of the columnar light emitting part 6 is formed of first unit layers 4a and second unit layers 4b alternately stacked in the stated order from the underlying substrate side so as to have a multi-quantum well (MQW) structure. The p-type layer 5 is formed of a p-type cladding layer 5a and a p-type cap layer 5b stacked in the stated order from the underlying substrate side.

The underlying substrate 1 is a polycrystalline substrate formed of a plurality of GaN crystals. The GaN crystals are oriented so that a c-axis direction of each of the GaN crystals approximately matches (is approximately aligned with) a direction (hereinafter, also simply referred to as a normal direction) normal to a main surface of the underlying substrate 1, and are connected to one another. The underlying substrate 1 is a kind of an oriented polycrystalline substrate, and is hereinafter also referred to as an oriented GaN substrate. Strictly speaking, however, the c-axis direction of each of the GaN crystals is slightly offset from the normal direction of the underlying substrate 1. An angle at which the c-axis direction of each of the GaN crystals is offset from the normal direction of the underlying substrate 1 is referred to as a tilt angle.

The underlying substrate 1 has crystal defects 1d, such as grain boundaries, attributable to the structure and the manufacturing method of the underlying substrate 1. Some of the crystal defects 1d penetrate the underlying substrate 1 in the normal direction. The underlying substrate 1, however, can be considered to have an approximately monocrystalline structure in the normal direction, and has crystallinity high enough to secure device properties such as a light emitting function. On the other hand, the underlying substrate 1 is not a monocrystalline substrate but is the oriented GaN substrate, and is thus characterized by having a lower manufacturing cost than a monocrystalline GaN substrate.

The underlying substrate 1 preferably has a thickness of approximately dozens of micrometers or more so as to be easily handled, e.g., held, in the manufacturing process of the light emitting device 10. An average grain diameter (more specifically, an average grain diameter in an in-plane direction of the main surface of the underlying substrate 1) D of the GaN crystals of the underlying substrate 1 is preferably 15 µm or more. Although there is no particular upper limit of the average grain diameter D in principle, an actual upper limit of the average grain diameter D is approximately 200 µm to actually manufacture a polycrystalline oriented GaN substrate. The method for manufacturing the underlying substrate 1 is described below.

The light confinement layer 2 is located at one main surface of the underlying substrate 1 so as to surround the plurality of columnar light emitting parts 6. The light confinement layer 2 is made of a material having a lower refractive index than the Group 13 nitride, which is a material for the columnar light emitting parts 6. In the case of GaN, the refractive index is approximately 2.4 to 2.6. Examples of the material for the light confinement layer 2 include $SiO_2$, $Al_2O_3$, SiN, and SiON, and $SiO_2$ is preferred as the light confinement layer 2 made of $SiO_2$ is easy to manufacture. Light generated by the columnar light emitting parts 6 is propagated in the longitudinal direction of the columnar light emitting parts 6 while repeatedly being reflected at interfaces between the columnar light emitting parts 6 and the light confinement layer 2, and is eventually released to the outside of the device through the transparent conductive film 7. This means that the light confinement layer 2 has the effect of confining light generated by the columnar light emitting parts 6 in the columnar light emitting parts 6. The light confinement effect increases the light extraction efficiency of the light emitting device 10.

The light confinement layer 2 has a two-layer structure of the first light confinement layer 2a and the second light confinement layer 2b as described above. The first light confinement layer 2a is a layer used as a mask for defining the positions of the columnar light emitting parts 6 at formation of the columnar light emitting parts 6, although the details thereof are described below. The two layers, however, are exactly similar to each other in respect of producing the light confinement effect.

The first light confinement layer 2a preferably has a thickness of 100 nm to 1000 nm so as to properly function as the mask. The thickness of the light confinement layer 2 as a whole is the same as the thickness (longitudinal size) of the columnar light emitting parts 6.

The columnar light emitting parts 6 are parts of the light emitting device 10 actually playing a role in light emission, and are located as cylindrical, polygonal columnar, or other columnar (rod-like) stack structures extending along the normal direction on the main surface of the underlying substrate 1 on which the light confinement layer 2 is located. The columnar light emitting parts 6 are formed by sequentially epitaxially growing a plurality of layers made of the Group 13 nitride on the main surface of the underlying substrate 1. In the light emitting device 10, the plurality of columnar light emitting parts 6 are discretely located on the main surface of the underlying substrate 1.

The columnar light emitting parts 6 each have a stack of the n-type layer 3, the active layer 4 having the MQW structure of the first unit layers 4a and the second unit layers 4b, and the p-type layer 5 having the p-type cladding layer 5a and the p-type cap layer 5b as described above. The c-axis direction of each of the columnar light emitting parts 6 matches the c-axis direction of GaN crystals immediately under the columnar light emitting part 6. This means that the c-axis direction of each of the columnar light emitting parts 6 approximately matches the normal direction of the underlying substrate 1.

The n-type layer 3 is preferably made of GaN doped with Si so as to have an electron concentration of $2\times10^{18}/cm^3$ to $2\times10^{19}/cm^3$, and preferably has a thickness of 400 nm to 5000 nm.

Each of the first unit layers 4a of the active layer 4 is preferably made of the Group 13 nitride having composition of $In_xGa_{1-x}N$ ($0<x\leq0.2$) and preferably has a thickness of 2 nm to 10 nm, each of the second unit layers 4b of the active layer 4 is preferably made of GaN and preferably has a thickness of 5 nm to 15 nm, and the number of repetitions of a pair of the first unit layer 4a and the second unit layer 4b is preferably three to eight.

The p-type cladding layer 5a is preferably made of the Group 13 nitride having composition of $Al_yGa_{1-y}N$ ($0<y\leq0.2$) doped with Mg so as to have a hole concentration of $5\times10^{17}/cm^3$ to $5\times10^{18}/cm^3$, and preferably has a thickness of 50 nm to 150 nm.

The p-type cap layer 5b is preferably made of GaN doped with Mg so as to have a hole concentration of $1\times10^{18}/cm^3$ to $1\times10^{19}/cm^3$, and preferably has a thickness of 200 nm to 650 nm.

With this structure, the longitudinal size of each of the columnar light emitting parts 6 is approximately 500 nm to 6000 nm. In the light emitting device 10, upper ends of all the columnar light emitting parts 6 (more specifically, upper ends of the p-type cap layers 5b) are flush with an upper surface of the light confinement layer 2 (more specifically, an upper surface of the second light confinement layer 2b), and thus the longitudinal size of each of the columnar light emitting parts 6 is the same as the thickness of the light confinement layer 2 in which the columnar light emitting parts 6 have been embedded.

Details of the columnar light emitting parts 6 and the effect based on how to form the columnar light emitting parts 6 are described below.

The transparent conductive film 7 is formed adjacent to the upper surface of the second light confinement layer 2b and the upper ends of all the columnar light emitting parts 6. All the columnar light emitting parts 6 are thereby electrically connected to the transparent conductive film 7. The transparent conductive film 7 is made of ITO or a zinc oxide so as to have a thickness of approximately 50 nm to 200 nm, for example.

The pad electrode 8 is electrically connected to the upper ends of the columnar light emitting parts 6. The pad electrode 8 is located on a part of an upper surface of the transparent conductive film 7. A preferred example of the pad electrode 8 is a Ti/Au stacked film. It is preferable that a Ti film and an Au film constituting the Ti/Au stacked film as the pad electrode 8 respectively have thicknesses of approximately 20 nm to 200 nm and 50 nm to 500 nm.

The cathode electrode 9 is electrically connected to ends of the columnar light emitting parts 6 closer to the underlying substrate 1. The cathode electrode 9 is located on an almost whole main surface of the underlying substrate 1 opposite to the main surface of the underlying substrate 1 on which the columnar light emitting parts 6 and the like are located. The cathode electrode 9 is preferably formed as a Ti/Al/Ni/Au multilayer film. It is preferable that a Ti film, an Al film, an Ni film, and an Au film constituting the Ti/Al/Ni/Au multilayer film as the cathode electrode 9 respectively have thicknesses of approximately 10 nm to 30 nm, 150 nm to 1000 nm, 20 nm to 100 nm, and 50 nm to 500 nm.

<Details of Columnar Light Emitting Parts>

The columnar light emitting parts 6, in particular, the positions and the sizes of the columnar light emitting parts 6 and the effect thereof are described in detail below.

In the light emitting device 10, the columnar light emitting parts 6 are discretely located on one main surface of the underlying substrate 1 as described above. More specifically, the columnar light emitting parts 6 are located at positions which are included in positions (hereinafter, referred to as candidate positions) of lattice points of a planar lattice (e.g., a hexagonal planar lattice and a square planar lattice) imaginarily determined on the main surface and having a predetermined period p and at which there are no crystal defects 1d. In other words, the columnar light emitting parts 6 are located at positions which are included in candidate positions two-dimensionally determined by the period p on one main surface of the underlying substrate 1 and located on areas (first areas) in which there are no crystal defects 1d. Each of the columnar light emitting parts 6 meets the requirement that a maximum size (maximum outside diameter size) d of the columnar light emitting part 6 in a cross section perpendicular to the longitudinal direction of the columnar light emitting part 6 is D/2 or less.

With this structure, in the light emitting device 10 according to the present embodiment, the columnar light emitting parts 6 are formed only on GaN crystals that can substantially be considered as monocrystals. This means that all the columnar light emitting parts 6 are formed without being affected by the crystal defects 1d, such as grain boundaries, of the underlying substrate 1. All the columnar light emitting parts 6 thus have high crystal quality.

Figure 3:
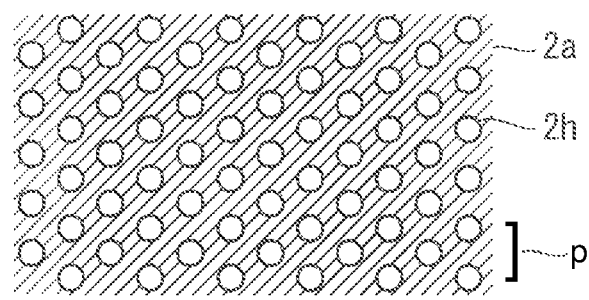
FIG. 3 is a plan view of an example of a first light confinement layer 2a having openings 2h that are each circular in plan view and are located at positions of lattice points of a hexagonal planar lattice.

As described below, the candidate positions of the columnar light emitting parts 6 are determined as positions of openings 2h which are formed at formation of the first light confinement layer 2a (see FIG. 3).

The period p is a value indicating a minimum pitch of the columnar light emitting parts 6, and is preferably approximately 15 μm to 70 μm, although it depends on a value of the average grain diameter D of the GaN crystals of the underlying substrate 1. In this case, the light emitting device 10 properly includes many columnar light emitting parts 6 meeting the above-mentioned requirement. Including many columnar light emitting parts 6 having high crystal quality contributes to an increase in emission intensity of the light emitting device 10.

If the period p is too small, the maximum outside diameter size d of each of the columnar light emitting parts 6 is naturally small, and a large number of candidate positions overlap the crystal defects 1d although the number of columnar light emitting parts 6 is large. Consequently, sufficient emission intensity cannot be obtained. On the other hand, in the case that the period p is too large, sufficient emission intensity cannot be obtained for the reason that the number of columnar light emitting parts 6 is small.

More specifically, the size d is preferably D/4 or less if the average grain diameter D is smaller than 20 μm, and is preferably D/3 or less if the average grain diameter D is equal to or larger than 20 μm. When these conditions are met, light emitting devices 10 having high emission intensity can be manufactured with a high yield.

On the other hand, there is no lower limit of the size d as long as the columnar light emitting parts 6 can be formed. If the size d is 1 μm or more, however, the columnar light emitting parts 6 can relatively easily be formed by MOCVD as described below. Alternatively, the columnar light emitting parts 6 can be formed so as to each have a size d of approximately 100 nm to 1000 nm by using a well-known nanowire formation method, for example.

In the light emitting device 10, at candidate positions of the columnar light emitting parts 6 immediately under which there are the crystal defects 1d, imperfect columnar parts (second columnar structures) 6r3 that have a similar stack structure (light emitting structure) to the columnar light emitting parts 6 but have a shorter longitudinal size than the columnar light emitting parts 6 are located, instead of the columnar light emitting parts 6. In other words, the imperfect columnar parts 6β are located at positions which are included in the candidate positions two-dimensionally determined by the period p on the main surface of the underlying substrate 1 and located on areas (second areas) in which there are the crystal defects 1d. The imperfect columnar parts 6β are parts formed under the same crystal growth conditions as the columnar light emitting parts 6 but having a lower growth rate than the columnar light emitting parts 6 since the origins (foundations) of growth of the imperfect columnar parts 6β are at the positions of the crystal defects 1d. In contrast to the columnar light emitting parts 6, upper ends of the imperfect columnar parts 6β are covered with the second light confinement layer 2b, and the imperfect columnar parts 6β are not electrically connected to the transparent conductive film 7. The imperfect columnar parts 6β thus do not contribute to light emission.

Figure 6:
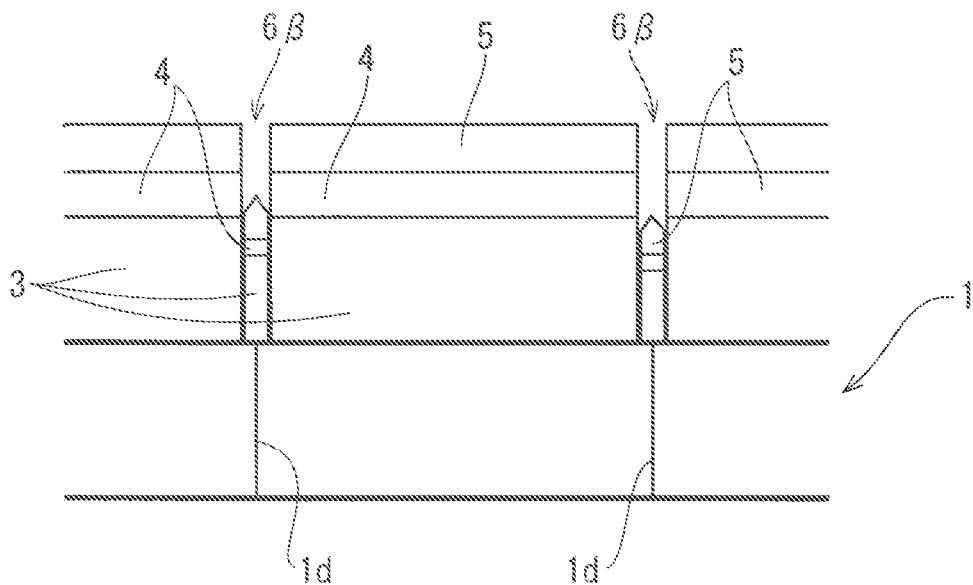
FIG. 6 shows an example of a light emitting structure of a whole-surface stacked light emitting device.

In the case of a light emitting device (hereinafter, referred to as a whole-surface stacked light emitting device) including the oriented GaN substrate as the underlying substrate 1 as in the present embodiment and a light emitting structure (LED structure) of an n-type layer, an active layer, and a p-type layer sequentially stacked on an almost whole one main surface of the substrate as with a conventional light emitting device, the LED structure of the n-type layer, the active layer, and the p-type layer can be discontinuous in an in-plane direction due to the crystal defects 1d of respective crystal grains constituting the oriented GaN substrate, at positions on the crystal defects 1d. FIG. 6 shows an example of the light emitting structure of the whole-surface stacked light emitting device to explain the above-mentioned point. As shown in FIG. 6, also in the case of the whole-surface stacked light emitting device, the imperfect columnar parts 6β where sizes in a stacking direction of the n-type layer 3, the active layer 4, and the p-type layer 5 which constitute the light emitting structure are smaller than those in surrounding parts are formed due to a lower growth rate on the crystal defects 1d. Therefore, the layers are discontinuous in the in-plane direction, and a normally-formed n-type layer 3 may be in contact with the active layer 4 and the p-type layer 5 of the imperfect columnar part 6β, or a normally-formed active layer 4 may be in contact with the p-type layer 5 of the imperfect columnar part 6β. In particular, if the active layer 4 (specifically, the MQW structure) is discontinuous, a p-type electrode formed on the p-type layer 5 might be in contact with the active layer 4 or the n-type layer 3 unfavorably, and this may cause current leakages. Furthermore, the oriented GaN substrate has the crystal defects 1d at irregular positions, making it difficult to grow crystals on the surface of the substrate at positions other than the positions of the crystal defects 1d and to form an electrode on a part other than parts grown on the crystal defects 1d in the case of the whole-surface stacked light emitting device.

On the other hand, in the case of the light emitting device 10 according to the present embodiment, only the imperfect columnar parts 6β not electrically connected to the transparent conductive film 7 are located on the crystal defects 1d, and the columnar light emitting parts 6 are not located on the crystal defects 1d. Occurrence of current leakages can thus properly be suppressed. From another perspective, it can be understood that, in the light emitting device 10 according to the present embodiment, the imperfect columnar parts 6β are located on the crystal defects 1d to suppress occurrence of current leakages. This means that the imperfect columnar parts 6β of the light emitting device 10 function as current leakage suppression parts.

In the case of the light emitting device 10 according to the present embodiment, a ratio of the area of parts playing a role in light emission to the area of one main surface of the underlying substrate 1 is lower than that in the whole-surface stacked light emitting device. The light emitting device 10 according to the present embodiment, however, has higher light extraction efficiency than the whole-surface stacked light emitting device, since it includes the light confinement layer 2 around the columnar light emitting parts 6 as described above.

With the above-mentioned structure, the light emitting device 10 according to the present embodiment has high emission intensity while including the oriented GaN substrate as the underlying substrate 1.

<Method for Manufacturing Light Emitting Device>

The method for manufacturing the light emitting device 10 according to the present embodiment is described below. A case of preparing the underlying substrate 1 in the form of a mother substrate (wafer) and manufacturing many light emitting devices 10 at a time, which is so-called multi-piece machining, is described below. FIGS. 2A to 2F schematically show the light emitting device 10 during manufacture.

First, an oriented GaN substrate having the crystal defects 1d, such as grain boundaries, as shown in FIG. 2A is prepared (manufactured) as the underlying substrate 1. An example of the method for manufacturing the oriented GaN substrate includes a flux method (an Na flux method).

In the flux method, an oriented alumina substrate, which is an oriented polycrystalline substrate, is prepared first.

The oriented alumina substrate is made of a polycrystalline alumina sintered body in which alumina ($Al_2O_3$) grains having an average grain diameter of approximately 15 μm to 70 μm at one main surface are oriented so that the c-axis of the alumina grains approximately matches the normal direction of the substrate. The size of the alumina substrate is not particularly limited as long as the alumina substrate can be handled in subsequent processing. The alumina substrate, however, preferably has a diameter of approximately two inches to eight inches and a thickness of approximately 500 μm to 2000 μm, for example.

Then, a GaN low-temperature buffer layer having a thickness of approximately 20 nm to 30 nm and a GaN layer having a thickness of approximately 1 μm to 5 μm are sequentially formed on one main surface of the oriented alumina substrate by MOCVD using hydrogen as a carrier gas and TMG (trimethylgallium) and ammonia as a source gas to obtain a seed substrate. The GaN low-temperature buffer layer is preferably formed at a temperature of approximately 510° C. to 530° C., and the GaN layer is preferably formed at a temperature of approximately 1050° C. to 1150° C.

The seed substrate is loaded into an alumina crucible along with metal Ga and metal Na each having a weight determined in accordance with the size of the alumina substrate, and the alumina crucible is placed in a growth vessel made of refractory metal, and is sealed. The growth vessel is placed in a heat and pressure resistant crystal growth furnace. After temperature in the furnace is set to 750° C. to 900° C., and pressure in the furnace is controlled to 3 MPa to 5 MPa by introducing nitrogen gas into the furnace, the growth vessel is held for 50 hours to 100 hours while being rotated horizontally, thereafter to grow a GaN thick film layer having a thickness of approximately 250 μm to 500 μm. In this case, the resulting GaN thick film layer is an oriented polycrystalline layer in which crystal grains are oriented along the c-axis based on a crystal orientation of individual crystal grains constituting the alumina substrate as a base.

After an oriented alumina substrate side is removed by grinding using a grinder and the like, the GaN thick film layer is polished so as to have a desired thickness by using a well-known method, such as a method using diamond abrasive grains, to obtain the oriented GaN substrate.

The GaN thick film layer formed on the oriented alumina substrate is also a polycrystalline layer and the c-axis of each of its crystal grains approximately matches the normal direction of the substrate as with the oriented alumina substrate, but it has the crystal defects 1d, such as grain boundaries. The resulting oriented GaN substrate thus has this feature.

After the oriented GaN substrate as the underlying substrate 1 is obtained, the first light confinement layer 2a is formed on one main surface of the oriented GaN substrate as shown in FIG. 2B. The first light confinement layer 2a is formed such that the openings 2h, which are through-holes, are located at positions of lattice points of a planar lattice (e.g., a hexagonal planar lattice and a square planar lattice) in plan view. FIG. 3 is a plan view of an example of the first light confinement layer 2a having the openings 2h that are each circular in plan view and are located at positions of lattice points of a hexagonal planar lattice. As described above, the positions of the openings 2h correspond to the candidate positions of the columnar light emitting parts 6. This means that the first light confinement layer 2a functions as a mask to form the columnar light emitting parts 6 (and the imperfect columnar parts 6β). In other words, the columnar light emitting parts 6 and the imperfect columnar parts 6β are formed at the positions of the openings 2h.

A maximum outside diameter size of each of the openings 2h may approximately match with the maximum outside diameter size d of each of the columnar light emitting parts 6, and the period p is preferably approximately 30 μm to 100 μm as described above. The positions of the openings 2h, i.e., the candidate positions of the columnar light emitting parts 6, are determined in a mechanical manner without considering the positions of the crystal defects 1d that are irregular in the underlying substrate 1.

The first light confinement layer 2a as described above can be formed by forming a layer made of a material, such as $SiO_2$, $Al_2O_3$, SiN, and SiON, having a lower refractive index than the Group 13 nitride, which is a material for the columnar light emitting parts 6, for example, by sputtering or CVD, so that the layer has a thickness of 0.05 μm to 5 μm, and then patterning the layer by a photolithography process and an RIE etching process to form the openings 2h each having an opening diameter d.

After formation of the first light confinement layer 2a ends, the columnar light emitting parts 6 are formed in the openings 2h as shown in FIG. 2C. The columnar light emitting parts 6 are formed by MOCVD.

First, the underlying substrate 1 on which the first light confinement layer 2a has been formed is placed on a susceptor in an MOCVD furnace so that a side of the underlying substrate 1 on which the first light confinement layer 2a has been formed is a formation surface. A substrate temperature (susceptor temperature) is then set to a predetermined n-type layer formation temperature of 1050° C. to 1150° C. in a mixed atmosphere of hydrogen and nitrogen, and Si-doped GaN layers, which are the n-type layers 3, are grown in the openings 2h on the underlying substrate 1 using nitrogen and hydrogen as a carrier gas, TMG (trimethylgallium) and ammonia as a source, and silane gas as a dopant.

Next, the substrate temperature (susceptor temperature) is set to a predetermined active layer formation temperature of 750° C. to 850° C., and the first unit layers 4a made of the Group 13 nitride having composition of $In_xGa_{1-x}N$ ($0<x\leq0.2$) and the second unit layers 4b made of GaN are repeatedly and alternately formed on the n-type layers 3 in the stated order from a side of the underlying substrate 1 using nitrogen and hydrogen as a carrier gas, and TMG, TMI (trimethylindium), and ammonia as a source to form the active layers 4 having the MQW structure.

Furthermore, the substrate temperature (susceptor temperature) is set to a predetermined p-type layer formation temperature of 1000° C. to 1100° C., and the p-type cladding layers 5a made of the Group 13 nitride having composition of $Al_yGa_{1-y}N$ ($0<y\leq0.2$) and doped with Mg and the p-type cap layers 5b made of GaN doped with Mg are formed on the active layers 4 in the stated order using nitrogen and hydrogen as a carrier gas, TMG, TMA (trimethylaluminum), and ammonia as a source, and $Cp_2Mg$ as a dopant to form the p-type layers 5. In forming the p-type cap layers 5b, upper ends 5e of the p-type cap layers 5b are polished in subsequent processing, so it is necessary to determine the thickness of the p-type cap layers 5b in anticipation of reduction in thickness by polishing. Specifically, since each of the p-type cap layers 5b preferably has a thickness of 50 nm to 200 nm as described above, it is appropriate that the p-type cap layers 5b are each formed to have a thickness approximately 100 nm to 300 nm larger than the above-mentioned thickness.

The columnar light emitting parts 6 are formed in the openings 2h by performing the above-mentioned procedure. The crystal defects 1d may be located immediately under some of the openings 2h, because the positions of the openings 2h are determined in a mechanical manner as described above. However, at positions of the crystal defects 1d, the imperfect columnar parts 6β that are shorter than the columnar light emitting parts 6 are formed at a lower growth rate than the columnar light emitting parts 6, and thus the columnar light emitting parts 6 each having a desired size are actually formed at positions at which there are no crystal defects 1d immediately under the openings 2h. In other words, in the present embodiment, it can be said that grain boundary parts of the GaN crystals of the underlying substrate 1 are excluded from the positions of the columnar light emitting parts 6 by using the difference in growth rate caused by the difference in a state of origins (foundations) of growth, without making any particular control and distinction.

After formation of the columnar light emitting parts 6 ends, the second light confinement layer 2b is formed as shown in FIG. 2D. The second light confinement layer 2b is formed of a material, such as $SiO_2$, $Al_2O_3$, SiN, and SiON, having a lower refractive index than the Group 13 nitride, which is a material for the columnar light emitting parts 6, as with the first light confinement layer 2a, so as to fill gaps between the columnar light emitting parts 6 and the imperfect columnar parts 6β and so as to cover the upper ends 5e of the p-type layers 5, which are uppermost layers of the columnar light emitting parts 6. In other words, the second light confinement layer 2b is formed so as to cover exposed portions of the columnar light emitting parts 6 and the imperfect columnar parts 6β. The second light confinement layer 2b is preferably formed by sputtering, for example. The second light confinement layer 2b is preferably formed so that the light confinement layer 2 including the first light confinement layer 2a and the second light confinement layer 2b as a whole has a thickness of approximately 0.8 μm to 8 μm. In this case, the upper ends of the imperfect columnar parts 6β are naturally covered with the second light confinement layer 2b.

After formation of the second light confinement layer 2b ends, a surface portion of the second light confinement layer 2b is polished to expose the p-type layers 5 (more specifically, the p-type cap layers 5b) to thereby form a planar surface including upper surfaces 5s of the p-type layers 5 and an upper surface 2s of the second light confinement layer 2b as shown in FIG. 2E. CMP polishing is preferably employed in this polishing, and it is favorable to perform the polishing on condition that the second light confinement layer 2b is polished (chemically etched) at a speed equal to or higher than a speed at which the p-type layers 5 are polished.

After polishing processing ends, heat treatment is performed in a nitrogen atmosphere at 750° C. to 850° C. for 10 minutes to 20 minutes in a rapid thermal annealing (RTA) furnace to activate the p-type layers 5.

Next, isolation trenches serving as separation positions in eventually obtaining many light emitting devices 10 are formed by the photolithography process and RIE etching, and then the cathode electrode 9, the transparent conductive film 7, and the pad electrode 8 are formed in the stated order.

The cathode electrode 9 is preferably formed by the photolithography process and vacuum deposition on an almost whole main surface of the underlying substrate 1 opposite to the surface of the underlying substrate 1 on which the first light confinement layer 2a has been formed.

After the cathode electrode 9 is formed, heat treatment is performed in a nitrogen atmosphere at 600° C. to 650° C. for 50 seconds to 300 seconds to obtain good ohmic contact properties of the cathode electrode 9.

The transparent conductive film 7 is preferably formed by sputtering on an almost whole planar surface including the upper surfaces 5s of the p-type layers 5 and the upper surface 2s of the second light confinement layer 2b.

The pad electrode 8 is preferably formed by the photolithography process and vacuum deposition on the part of the upper surface of the transparent conductive film 7. After the pad electrode 8 is formed, heat treatment is performed in a nitrogen atmosphere at 600° C. to 650° C. for one minute to five minutes to obtain good ohmic contact properties of the pad electrode 8.

Eventually, cutting is performed with a dicer or the like along the isolation trenches previously formed, to obtain many light emitting devices 10 (FIG. 2F).

In a case where many light emitting devices 10 are manufactured in procedure as described above, some light emitting devices 10 might include insufficient number of columnar light emitting parts 6 depending on the cutting positions and the positions of the crystal defects 1d, because distribution of the crystal defects 1d of the underlying substrate 1 is irregular. But, the probability that such light emitting devices 10 are formed is limited by properly determining the size d of each of the columnar light emitting parts 6 and the period P of the openings 2h. In other words, light emitting devices 10 having high emission intensity can be manufactured with a high yield according to the present embodiment.

As described above, according to the present embodiment, the oriented GaN substrate, which is an oriented polycrystalline substrate that is less expensive and easier to manufacture than the monocrystalline substrate, is used as the underlying substrate, the columnar light emitting parts each formed of a stack of the n-type layer, the active layer, and the p-type layer each made of the Group 13 nitride are discretely located on one main surface of the underlying substrate at positions at which there are no crystal defects, such as grain boundaries, and the light confinement layer made of a material having a lower refractive index than the Group 13 nitride, which is a material for the columnar light emitting parts, is located around the columnar light emitting parts. As a result, a light emitting device with a vertical structure having high light extraction efficiency and suppressed current leakages can be achieved.

In addition, although the candidate positions of the columnar light emitting parts are determined in a mechanical manner as the positions of the lattice points of the planar lattice regardless of whether there is a crystal defect immediately under each of the candidate positions, the columnar light emitting parts can properly be formed on the underlying substrate only at positions at which there are no crystal defects by utilizing the fact that the Group 13 nitride has a lower growth rate in a case where the origin of growth of the Group 13 nitride is at a position of a crystal defect, such as a grain boundary, compared to a case where the origin is at a position at which there is no crystal defect.

Modification of First Embodiment

FIGS. 4A to 4F schematically show a light emitting device 110 according to a modification of the first embodiment during manufacture. Components of the light emitting device 110 according to the modification that are the same as those of the light emitting device 10 according to the first embodiment bear the same reference signs, and detailed description thereof is omitted.

Figure 4A:
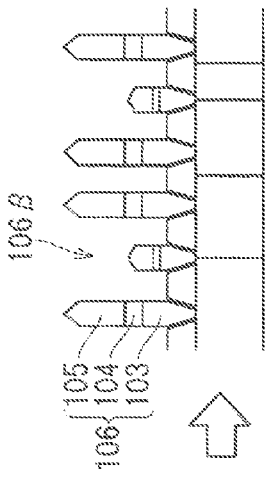
FIGS. 4A to 4F schematically show a light emitting device 110 according to a modification of the first embodiment during manufacture.
Figure 4B:
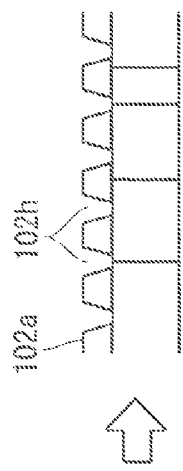

As shown in FIG. 4A, the underlying substrate 1 prepared in the modification is similar to that prepared in the first embodiment. As shown in FIG. 4B, however, openings 102h of a first light confinement layer 102a have different shapes from the openings 2h of the first light confinement layer 2a of the light emitting device 10, and are tapered (trapezoidal when viewed in cross section) so as to be wider towards upper ends. This is achieved by rotating the underlying substrate 1 while tilting the underlying substrate 1 during RIE etching for forming the openings 102h.

Figure 4C:
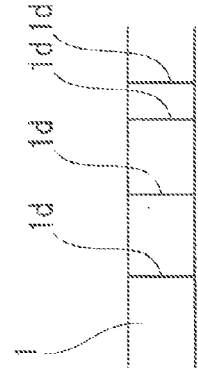

Following formation of the openings 102h, columnar light emitting parts 106 are formed under the same conditions as the conditions to form the columnar light emitting parts 6 in the first embodiment. As shown in FIG. 4C, however, outside diameter sizes of n-type layers 103, active layers 104, and p-type layers 105 of the columnar light emitting parts 106 are larger than those of the columnar light emitting parts 6 due to the shapes of the openings 102h.

Figure 4D:
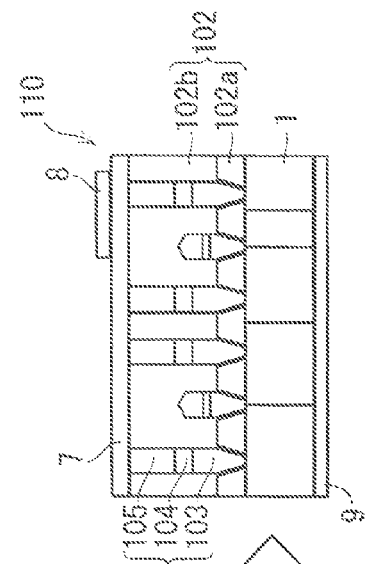
Figure 4E:
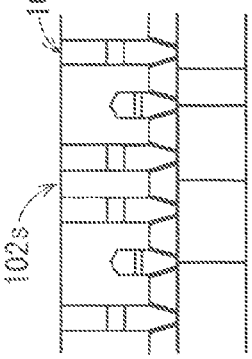
Figure 4F:
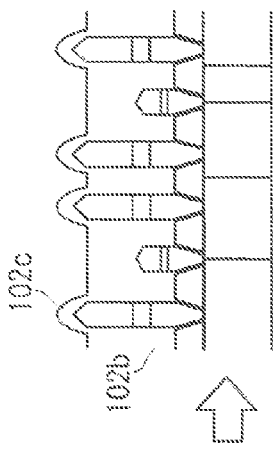

Formation of a second light confinement layer 102b and formation of a planar surface including upper surfaces 105s of the p-type layers 105 and an upper surface 102s of the second light confinement layer 102b by polishing processing are then performed as shown in FIGS. 4D and 4E, and formation of isolation trenches and formation of the cathode electrode 9, the transparent conductive film 7, and the pad electrode 8 are further performed in a similar manner to that in the first embodiment, to obtain the light emitting device 110 shown in FIG. 4F.

As can be seen from the procedure for manufacturing the light emitting device 110, the n-type layers 103 of the columnar light emitting parts 106 are tapered at portions neighborhood of the underlying substrate so as to have larger outside diameter sizes towards upper sides, and thus the areas of interfaces between the n-type layers 103 and the underlying substrate 1 are smaller than cross sectional areas of the active layers 104 parallel to the interfaces. As a result, the light emitting device 110 has higher light extraction efficiency than the light emitting device 10 in which the areas of the interfaces between the n-type layers 103 and the underlying substrate 1 are the same as the cross sectional areas of the active layers 104.

Second Embodiment

As described above, it is described in the first embodiment (and in the modification of the first embodiment), use of the GaN substrate, which is an oriented polycrystalline substrate, as the underlying substrate 1 enables to achieve a light emitting device with a vertical structure having high light extraction efficiency. In the present embodiment, a light emitting device 210 having a horizontal structure is described.

FIGS. 5A to 5F schematically show the light emitting device 210 according to the second embodiment during manufacture. Components of the light emitting device 210 according to the present embodiment that are the same as those of the light emitting device 10 according to the first embodiment bear the same reference signs, and detailed description thereof is omitted. A case of preparing an underlying substrate 201 in the form of a mother substrate and manufacturing many light emitting devices 210 at a time, which is so-called multi-piece machining, is described below.

As shown in FIG. 5A, in the present embodiment, a substrate including an oriented alumina substrate 201a and an underlying layer 201b formed on an almost whole one main surface of the oriented alumina substrate 201a and having n-type conductivity is used as the underlying substrate 201.

The oriented alumina substrate 201a is made of a polycrystalline alumina sintered body in which alumina ($Al_2O_3$) grains having an average grain diameter D of approximately 15 µm to 70 µm at one main surface are oriented so that the c-axis of the alumina grains approximately matches the normal direction of the substrate. The size of the oriented alumina substrate 201a is not particularly limited as long as the oriented alumina substrate 201a can be handled in subsequent processing. The oriented alumina substrate 201a, however, preferably has a diameter of approximately two inches to eight inches and a thickness of approximately 500 µm to 2000 µm, for example.

The underlying layer 201b is formed by MOCVD. First, the oriented alumina substrate 201a is placed on a susceptor in an MOCVD furnace, and is cleaned by being held in a hydrogen atmosphere and heated at 1150° C. to 1250° C. A substrate temperature (susceptor temperature) is then reduced to a low-temperature buffer layer formation temperature of 500° C. to 550° C., and a GaN low-temperature buffer layer, which is not shown, is grown so as to have a thickness of 10 nm to 30 nm using hydrogen as a carrier gas and TMG and ammonia as a source. The substrate temperature (susceptor temperature) is then set to a predetermined underlying layer formation temperature of 1080° C. to 1120° C., and an Si-doped GaN layer serving as the underlying layer 201b is grown so as to have a thickness of 2 µm to 5 µm using nitrogen and hydrogen as a carrier gas, TMG and ammonia as a source, and silane gas as a dopant.

The oriented alumina substrate 201a has crystal defects 201d, such as grain boundaries, as with the underlying substrate 1 of the light emitting device 10 according to the first embodiment. Portions of the underlying layer 201b located on the crystal defects 201d have lower crystal qualities than the other portions.

Once the underlying substrate 201 is prepared, formation of the first light confinement layer 2a serving as the mask through formation of the planar surface including the upper surfaces 5s of the p-type layers 5 and the upper surface 2s of the second light confinement layer 2b by polishing processing are performed in similar procedure to that in the first embodiment as shown in FIGS. 5B to 5E. Preferred requirements of the period P of the openings 2h and the opening diameter d of each of the openings 2h (the relationship between the opening diameter d and the crystal grain diameter D) and other creation conditions may be similar to those in the first embodiment.

When the columnar light emitting parts 6 are formed in the present embodiment, the imperfect columnar parts 6β having a smaller size than the columnar light emitting parts 6 are formed above the crystal defects 201d as in the first embodiment. In the resulting light emitting device 210, occurrence of current leakages due to the presence of the crystal defects 201d are thus properly suppressed as in the light emitting device 10.

Isolation trenches are then formed in a similar manner to that in the first embodiment, and then the underlying layer 201b is partially exposed by the photolithography process and RIE etching to secure a position of a cathode electrode 209 (FIG. 5F). The cathode electrode 209 is formed at the exposed position by the photolithography process and vacuum deposition. The cathode electrode 209 may be made of a similar material and have a similar thickness to those in the first embodiment. Furthermore, the transparent conductive film 7 and the pad electrode 8 are formed in a similar manner to that in the first embodiment. As a result, the light emitting device 210 having the horizontal structure shown in FIG. 5F is obtained.

The light emitting device 210 as a whole has the horizontal structure, and includes the oriented alumina substrate as the underlying substrate. The columnar light emitting parts 6, however, are formed in a similar manner to that in the light emitting device 10 according to the first embodiment. The light emitting device 210 according to the present embodiment thus has high light extraction efficiency and suppressed current leakages while including the oriented polycrystalline substrate as the underlying substrate, which is less expensive and easier to manufacture than the monocrystalline substrate, as with the light emitting device 10 according to the first embodiment.

[Examples]

(Examples)

A plurality of types of light emitting devices having similar structures to the light emitting device 10 according to the first embodiment were manufactured.

Specifically, 24 types of light emitting devices (Samples Nos. 1 to 24) having three different levels of the average grain diameter D (15 µm, 30 µm, and 50 µm) in the oriented GaN substrate and eight different levels of the opening diameter d (1 µm, 2 µm, 5 µm, 10 µm, 15 µm, 20 µm, and 25 µm) of each of the openings 2h (maximum outside diameter size d of each of the columnar light emitting parts 6) were manufactured.

First, oriented GaN substrates each serving as the underlying substrate 1 were manufactured by the flux method. Eight oriented alumina substrates were first prepared for each of three types of average grain diameters (15 µm, 30 µm, and 50 µm) at one main surface, and the oriented GaN substrates were manufactured using these oriented alumina substrates. Each of the oriented alumina substrates has a diameter of two inches and a thickness of 400 µm.

For each of the oriented alumina substrates, a GaN low-temperature buffer layer having a thickness of 20 nm was formed by MOCVD, and then a GaN layer having a thickness of 3 µm was formed to obtain three types of seed substrates. The GaN low-temperature buffer layer was formed at a temperature of 520° C., and the GaN layer was formed at a temperature of 1100° C.

A GaN thick film layer was grown for each of the three types of seed substrates by the flux method. In this case, the weight of metal Ga and the weight of metal Na loaded into an alumina crucible along with each of the seed substrates were respectively 20 g and 40 g. The temperature in a crystal growth furnace was set to 850° C., and pressure in the furnace was set to 4 MPa. The holding time was set to 20 hours. As a result, the GaN thick film layer having a thickness of approximately 500 µm was grown on each of the seed substrates. After the alumina crucible was cooled to a room temperature, each of the seed substrates on which the GaN thick film layer has been formed was taken out of the alumina crucible.

After an oriented alumina substrate side was removed by grinding using the grinder, the GaN thick film layer was polished using diamond abrasive grains so as to have a thickness of 300 µm. As a result, three types of oriented GaN substrates were obtained. Average grain diameters at one main surfaces of the three types of oriented GaN substrates thus obtained were approximately similar to the average grain diameters (15 µm, 30 µm, and 50 µm) in the oriented alumina substrates as bases.

Next, the first light confinement layer 2a was formed on each of the obtained oriented GaN substrates. Specifically, an SiO$_2$ layer having a thickness of 0.1 μm was first formed by sputtering. The layer was then patterned to form the openings 2h having a different one of opening diameters d by the photolithography process and the RIE etching process. In each of the oriented GaN substrates, the openings 2h were formed at positions of lattice points of a hexagonal planar lattice. The period p was set to 30 for each of the oriented GaN substrates.

After formation of the first light confinement layer 2a ended, the columnar light emitting parts 6 were formed by MOCVD.

First, the substrate temperature was set to 1100° C., and an Si-doped GaN layer having an electron concentration of 5×10$^{18}$/cm$^3$ was formed as the n-type layer 3 so as to have a thickness of 0.7 μm.

The substrate temperature was then set to 750° C., and five first unit layers 4a each made of In$_{0.1}$Ga$_{0.9}$N and having a thickness of 2 nm and five second unit layers 4b each made of GaN and having a thickness of 10 nm were formed in the stated order from the side of the underlying substrate 1 to form the active layer 4.

The substrate temperature was then set to 1100° C., and an Mg-doped Al$_{0.1}$Ga$_{0.9}$N layer having a hole concentration of 5×10$^{17}$/cm$^3$ was formed as the p-type cladding layer 5a so as to have a thickness of 25 nm and an Mg-doped GaN layer having a hole concentration of 5×10$^{18}$/cm$^3$ was formed as the p-type cap layer 5b so as to have a thickness of 200 nm.

After formation of the columnar light emitting parts 6 ended, an SiO$_2$ layer was formed as the second light confinement layer 2b by sputtering. The second light confinement layer 2b was formed so that the light confinement layer 2 as a whole has a thickness of 1 μm.

After formation of the second light confinement layer 2b ended, a surface portion of the second light confinement layer 2b was polished to expose the p-type layers 5 (more specifically, the p-type cap layers 5b) by CMP polishing.

After polishing processing ended, heat treatment was performed in a nitrogen atmosphere at 800° C. for 10 minutes in the rapid thermal annealing (RTA) furnace to activate the p-type layers 5.

Next, the isolation trenches serving as the separation positions in eventually obtaining many light emitting devices 10 were formed by the photolithography process and RIE etching.

A Ti/Al/Ni/Au multilayer electrode was then formed as the cathode electrode 9 by the photolithography process and vacuum deposition on an almost whole main surface of the underlying substrate 1 opposite to the main surface of the underlying substrate 1 on which the first light confinement layer 2a was formed. The Ti film, the Al film, the Ni film, and the Au film constituting the Ti/Al/Ni/Au multilayer electrode were respectively set to have thicknesses of 15 nm, 220 nm, 40 nm, and 75 nm.

After the cathode electrode 9 was formed, heat treatment was performed in a nitrogen atmosphere at 700° C. for 30 seconds to obtain good ohmic contact properties of the cathode electrode 9.

An ITO film was then formed as the transparent conductive film 7 by sputtering on an almost whole planar surface including the upper surfaces 5s of the p-type layers 5 and the upper surface 2s of the second light confinement layer 2b at a substrate temperature of 200° C. so as to have a thickness of 100 nm.

A Ti/Au multilayer electrode was then formed as the pad electrode 8 by the photolithography process and vacuum deposition on the part of the upper surface of the transparent conductive film 7. The Ti film and the Au film constituting the Ti/Au multilayer electrode were respectively set to have thicknesses of 20 nm and 200 nm.

After the pad electrode 8 was formed, heat treatment was performed in a nitrogen atmosphere at 500° C. for five minutes to obtain good ohmic contact properties of the pad electrode 8.

Eventually, cutting was performed with the dicer or the like along the isolation trenches previously formed, to obtain many light emitting devices 10. The size of each of the devices was set to 0.3 mm×0.3 mm.

(Comparative Example)

A light emitting device including a different-material substrate as the underlying substrate and a light emitting layer formed on an almost whole surface of the different-material substrate was formed as a comparative example.

Specifically, the light emitting layer was formed on an almost whole one main surface of a monocrystalline sapphire substrate having a diameter of two inches and a thickness of 400 μm under the same conditions as the conditions to form the n-type layers 3, the active layers 4, and the p-type layers 5 according to the examples, the transparent conductive film 7 and the pad electrode 8 were formed on an upper surface of the light emitting layer under the same conditions as the conditions in the examples, the cathode electrode 9 was formed on another main surface of the sapphire substrate under the same conditions as the conditions in the examples, and then cutting was performed to manufacture many light emitting devices.

(Characteristic Evaluation)

Twenty light emitting devices were extracted for each of all the 24 types of light emitting devices 10 according to the examples and the light emitting device according to the comparative example as manufactured, and the amount of current was measured with a forward voltage of +5 V and a reverse voltage of −100 V being applied to each of the extracted light emitting devices. In a case where a ratio of the amount of current at application of the voltage of +5 V to the amount of current at application of the voltage of −100 V was 100 or more, the light emitting device was determined to be an acceptable product. A percentage (%) of acceptable products in all 20 light emitting devices was obtained to measure a device yield.

As for samples other than samples having a device yield of 0%, emission intensity of each of acceptable products was measured and a value of average emission intensity was calculated. The light emitting device according to the comparative example was set to a reference device, and a ratio (an emission intensity ratio) of average emission intensity of each of the samples according to the examples with respect to emission intensity of the reference device was obtained.

Table 1 shows the average grain diameter D in the oriented GaN substrate, the opening diameter d of each of the openings 2h, a ratio d/D of the opening diameter d to the average grain diameter D, the device yield, and the emission intensity ratio for each of all the 24 types of samples according to the examples as a list. In Table 1, the average grain diameter D in the oriented GaN substrate is indicated as "AVERAGE GRAIN DIAMETER D IN GaN SUBSTRATE", and the opening diameter d of each of the openings 2h is indicated as "OPENING DIAMETER d OF MASK". A yield of the light emitting device according to the comparative example was 10%.

TABLE 1

| SAMPLE NO | AVERAGE GRAIN DIAMETER D IN GaN SUBSTRATE [μm] | OPENING DIAMETER d OF MASK [μm] | d/D | DEVICE YIELD | EMISSION INTENSITY RATIO (RATIO TO EMISSION INTENSITY OF REFERENCE DEVICE) |
|---|---|---|---|---|---|
| 1 | 15 | 1 | 0.07 | 85% | 180% |
| 2 | 15 | 2 | 0.13 | 80% | 270% |
| 3 | 15 | 3 | 0.2 | 75% | 360% |
| 4 | 15 | 5 | 0.33 | 30% | 315% |
| 5 | 15 | 10 | 0.67 | 5% | 20% |
| 6 | 15 | 15 | 1 | 0% | — |
| 7 | 15 | 20 | 1.33 | 0% | — |
| 8 | 15 | 25 | 1.67 | 0% | — |
| 9 | 30 | 1 | 0.03 | 85% | 135% |
| 10 | 30 | 2 | 0.07 | 85% | 180% |
| 11 | 30 | 3 | 0.1 | 85% | 270% |
| 12 | 30 | 5 | 0.17 | 85% | 340% |
| 13 | 30 | 10 | 0.33 | 75% | 315% |
| 14 | 30 | 15 | 0.5 | 30% | 200% |
| 15 | 30 | 20 | 0.67 | 5% | 45% |
| 16 | 30 | 25 | 0.83 | 0% | — |
| 17 | 50 | 1 | 0.02 | 85% | 110% |
| 18 | 50 | 2 | 0.04 | 85% | 135% |
| 19 | 50 | 3 | 0.06 | 85% | 160% |
| 20 | 50 | 5 | 0.1 | 85% | 250% |
| 21 | 50 | 10 | 0.2 | 75% | 350% |
| 22 | 50 | 15 | 0.3 | 70% | 340% |
| 23 | 50 | 20 | 0.4 | 45% | 290% |
| 24 | 50 | 25 | 0.5 | 30% | 160% |

The results shown in Table 1 show that, when the ratio d/D is 0.5 or less, i.e., the opening diameter d is one half or less of the average grain diameter D, light emitting devices having higher emission intensity than that in the comparative example can be obtained, although some light emitting devices have a device yield of less than 50%.

Furthermore, when the average grain diameter D is 15 μm and the ratio d/D is 0.2 or less, a light emitting device having high emission intensity represented by an emission intensity ratio of more than 300% can be obtained with a device yield of 75% or more. This meets the requirement that a light emitting device having high emission intensity can be obtained with a high yield if the opening diameter d is D/4 or less when the average grain diameter D is less than 20 μm.

In addition, when the average grain diameter D is 30 μm and the ratio d/D is 0.33 or less, light emitting devices having high emission intensity represented by an emission intensity ratio of more than 300% can be obtained with a device yield of 75% or more. When the average grain diameter D is 50 μm and the ratio d/D is 0.3 or less, light emitting devices having high emission intensity represented by an emission intensity ratio of more than 300% can be obtained with a device yield of 70% or more. This meets the requirement that a light emitting device having high emission intensity can be obtained with a high yield if the opening diameter d is D/3 or less when the average grain diameter D is 20 μm or more.

These results show that a light emitting device having higher emission intensity than a light emitting device including a light emitting layer formed on an almost whole surface of a substrate can be achieved by properly forming the columnar light emitting parts and including the light confinement layer even when the oriented GaN substrate, which is an oriented polycrystalline substrate, is used as the underlying substrate.

While the invention has been described in detail, the foregoing description is in all aspects illustrative and not restrictive. It is therefore understood that numerous other modifications and variations can be devised without departing from the scope of the invention.

What is claimed is:

1. A method for manufacturing a light emitting device, comprising the steps of:

a) forming a first light confinement layer having a plurality of openings on or above one main surface of an oriented polycrystalline substrate, said oriented polycrystalline substrate including a plurality of oriented crystal grains so that said one main surface has a first area in which there are no crystal defects and a second area in which there is a crystal defect;

b) stacking an n-type layer, an active layer, and a p-type layer in the stated order in each of said plurality of openings on or above said one main surface of said oriented polycrystalline substrate using said first light confinement layer as a mask to thereby form a plurality of columnar structures, said plurality of columnar structures including a plurality of first columnar structures formed in openings on or above said first area and a second columnar structure formed in an opening on or above said second area and having a shorter longitudinal size than said plurality of first columnar structures;

c) forming a second light confinement layer on said first light confinement layer so that said second light confinement layer covers said plurality of first columnar structures and said second columnar structure, said second light confinement layer being formed of the same material as said first light confinement layer;

d) forming a transparent conductive film on said second light confinement layer so that said transparent conductive film is electrically connected only to said plurality of first columnar structures and is not electrically connected to said second columnar structure;

e) forming a pad electrode on said transparent conductive film, said pad electrode serving as an anode electrode; and f) forming a cathode electrode electrically connected to ends of said plurality of first columnar structures closer to said oriented polycrystalline substrate, wherein in said step a), said plurality of openings are determined as positions of lattice points of a planar lattice having a pitch between two adjacent columnar light emitting parts regardless of whether said first or second area lies under said plurality of openings, and in said steps a) and c), said first light confinement layer and said second light confinement layer are formed of a material having a lower refractive index than a material for said plurality of first columnar structures.

2. The method according to claim 1, wherein
$d \leq D/2$ holds true,
where D denotes an average grain diameter of said plurality of oriented crystal grains at said one main surface, and d denotes an opening diameter of each of said plurality of openings.

3. The method according to claim 1, wherein
$d \leq D/4$ holds true if $D < 20$ μm, and
$d \leq D/3$ holds true if $D \geq 20$ μm.

4. The method according to claim 1, wherein
in said step b), said n-type layer, said active layer, and said p-type layer are formed of a Group 13 nitride.

5. The method according to claim 4, wherein
said active layer is formed so as to have a MQW structure.

6. The method according to claim 4, wherein
said first light confinement layer and said second light confinement layer are formed of $SiO_2$.

7. The method according to claim 4, wherein
said step e) comprises the steps of:
- e-1) polishing said second light confinement layer so that upper ends of said plurality of first columnar structures and an upper surface of said second light confinement layer constitute a planar surface;
- e-2) forming said transparent conductive film on said planar surface; and
- e-3) forming said pad electrode on said transparent conductive film.

8. The method according to claim 1, wherein
said step e) comprises the steps of:
- e-1) polishing said second light confinement layer so that upper ends of said plurality of first columnar structures and an upper surface of said second light confinement layer constitute a planar surface;
- e-2) forming said transparent conductive film on said planar surface; and
- e-3) forming said pad electrode on said transparent conductive film.

9. The method according to claim 8, wherein
an oriented GaN substrate is used as said oriented polycrystalline substrate, and
in said step f), said cathode electrode is formed on another main surface of said oriented GaN substrate.

10. The method according to claim 8, wherein
an oriented alumina substrate is used as said oriented polycrystalline substrate, and
the method further comprises the step of
- g) forming an underlying layer having n-type conductivity on said oriented alumina substrate, in said step a), said first light confinement layer is formed on said underlying layer, in said step b), said plurality of first columnar structures are formed on said underlying layer above said first area, and in said step f), said cathode electrode is formed on said underlying layer.

* * * * *